(12) United States Patent
Smith et al.

(10) Patent No.: US 11,563,115 B2
(45) Date of Patent: Jan. 24, 2023

(54) SEMICONDUCTOR DEVICE

(71) Applicant: KABUSHIKI KAISHA TOSHIBA, Tokyo (JP)

(72) Inventors: Matthew David Smith, Kawasaki (JP); Akira Mukai, Kawasaki (JP); Masahiko Kuraguchi, Yokohama (JP)

(73) Assignee: KABUSHIKI KAISHA TOSHIBA, Tokyo (JP)

(*) Notice: Subject to any disclaimer, the term of this patent is extended or adjusted under 35 U.S.C. 154(b) by 69 days.

(21) Appl. No.: 17/150,029

(22) Filed: Jan. 15, 2021

(65) Prior Publication Data

US 2022/0149194 A1 May 12, 2022

(30) Foreign Application Priority Data

Nov. 12, 2020 (JP) .............................. JP2020-188493

(51) Int. Cl.
*H01L 29/778* (2006.01)
*H01L 29/423* (2006.01)
(Continued)

(52) U.S. Cl.
CPC ...... *H01L 29/7788* (2013.01); *H01L 29/0657* (2013.01); *H01L 29/0847* (2013.01);
(Continued)

(58) Field of Classification Search
CPC ............. H01L 29/7856; H01L 29/7783; H01L 29/66803; H01L 29/6653; H01L 29/7788;
(Continued)

(56) References Cited

U.S. PATENT DOCUMENTS 4,262,296 A * 4/1981 Shealy ................ H01L 29/1058
257/E29.313
8,575,689 B2 11/2013 Mimura et al.
(Continued)

FOREIGN PATENT DOCUMENTS

JP 2021-12913 A 2/2021

OTHER PUBLICATIONS

Zhou, Q. et al., "7.6 V Threshold Voltage High-Performance Normally-Off Al₂O₃/GaN MOSFET Achieved by Interface Charge Engineering," IEEE Electron Device Letters, vol. 37, No. 2, Feb. 2016, 4 pages.
Zhang, Y. et al., "Gallium nitride vertical power devices on foreign substrates: a review and outlook," Journal of Physics D: Applied Physics, vol. 51, No. 273001, 2018, 14 pages.
(Continued)

*Primary Examiner* — Natalia A Gondarenko
(74) *Attorney, Agent, or Firm* — Oblon, McClelland, Maier & Neustadt, L.L.P.

(57) ABSTRACT

According to the embodiment of the invention, the semiconductor device includes a semiconductor member, a first electrode, a second electrode, a third electrode, a first conductive member, and a first insulating member. The first semiconductor member includes a first semiconductor region, a second semiconductor region, and a third semiconductor region. The second semiconductor region includes one of a first material and a second material. The third semiconductor region is provided between at least a part of the first semiconductor region and the second semiconductor region. The first electrode is electrically connected with the first semiconductor region. The second electrode is electrically connected with the second semiconductor region. At least a part of the third semiconductor region is between an other portion of the third electrode and
(Continued)

the first conductive member. At least a part of the first insulating member is between the third electrode and the semiconductor member.

20 Claims, 8 Drawing Sheets

(51) Int. Cl.
*H01L 29/205* (2006.01)
*H01L 29/06* (2006.01)
*H01L 29/10* (2006.01)
*H01L 29/66* (2006.01)
*H01L 29/08* (2006.01)
*H01L 29/20* (2006.01)

(52) U.S. Cl.
CPC ........ *H01L 29/1037* (2013.01); *H01L 29/205* (2013.01); *H01L 29/4236* (2013.01); *H01L 29/42356* (2013.01); *H01L 29/66462* (2013.01); *H01L 29/66484* (2013.01); *H01L 29/2003* (2013.01); *H01L 29/7786* (2013.01)

(58) Field of Classification Search
CPC ............... H01L 29/66924; H01L 29/36; H01L 29/8083; H01L 29/2003; H01L 29/66462; H01L 29/66431; H01L 29/122–127; H01L 29/15–158; H01L 29/432; H01L 29/205; H01L 29/452; H01L 29/475; H01L 29/0657; H01L 29/0638; H01L 29/0684; H01L 29/7853; H01L 29/778–7789; H01L 29/66795; H01L 2924/13064; H01L 21/8232; H01L 21/823418; H01L 21/823431; H01L 21/823437; H01L 21/823487; H01L 21/823821; H01L 21/823885
USPC ............ 257/401, 76, 194, 256, 288, 29.246, 257/29.255, 29.312; 438/327, 308, 349, 438/358, 378, 394, 912, 798
See application file for complete search history.

(56) References Cited

U.S. PATENT DOCUMENTS

| | | | |
|---|---|---|---|
| 9,018,699 | B2 | 4/2015 | Kiyosawa et al. |
| 10,043,877 | B2 | 8/2018 | Kiyosawa et al. |
| 10,658,500 | B2 | 5/2020 | Lutgen et al. |
| 10,756,207 | B2 * | 8/2020 | Mishra ................ H01L 29/7789 |
| 2015/0221757 | A1 * | 8/2015 | Nakayama .......... H01L 23/5226 257/20 |
| 2016/0359030 | A1 | 12/2016 | Mishra et al. |
| 2019/0081164 | A1 | 3/2019 | Shrivastava |
| 2020/0011901 | A1 | 4/2020 | Lee et al. |
| 2020/0119179 | A1 | 4/2020 | Mishra et al. |
| 2021/0005730 | A1 | 1/2021 | Mukai et al. |

OTHER PUBLICATIONS

Shibata, D. et al., "1.7 kV /1.0 mΩcm$^2$ Normally-off Vertical GaN Transistor on GaN substrate with Regrown p-Gan/AlGaN/GaN Semipolar Gate Structure," 2016 IEEE International Electron Devices Meeting (IEDM), San Francisco, CA, 2016, doi: 10.1109/IEDM.2016.7838385, 4 pages.

Zhang, Y. et al., "1200 V GaN Vertical Fin Power Field-Effect Transistors," 2017 IEEE International Electron Devices Meeting (IEDM), San Francisco, CA, 2016, doi: 10.1109/IEDM.2017.8268357, 4 pages.

Song, S-H. et al., "SiO$_2$ Etch Rate and Profile Control Using Pulse Power in Capacitively Coupled Plasmas," The 20th International Symposium on Plasma Chemistry (ISPC-20), 2011, 4 pages.

Tegen, S. et al., "Etch Characteristics of Al$_2$O$_3$ in ICP and MERIE Plasma Etchers," Journal of The Electrochemical Society, vol. 152, No. 4, 2005, 7 pages.

Pavius, M. et al., "Profile Angle Control in SiO$_2$ Deep Anisotropic Dry Etching for MEMS Fabrication," International Conference on Micro Electro Mechanical Systems, Maastricht MEMS 2004, Technical Digest, Netherlands, 2004, 4 pages.

Bliznetsov, V. et al., "Deep Si02 etching with Al and AlN masks for MEMS devices," Journal of Micromechanics and Microengineering, vol. 25, No. 087002, 2015, 9 pages.

Osipov, K. et al., "Fabrication technology of GaN/AlGaN HEMT slanted sidewall gates using thermally reflowed ZEP resist and CHF$_3$/SF$_6$ plasma etching," CS MANTECH Conference, May 13-16, 2013, New Orleans, Louisiana, USA, 5 pages.

Nie, H. et al., 1.5-kV and 2.2-mΩcm$^2$ Vertical GaN Transistors on Bulk-GaN Substrates, IEEE Electron Device Letters, vol. 35, No. 9, Sep. 2014, 3 pages.

Oka, T. et al., "1.8 mQcm$^2$ vertical GaN-based trench metal-oxide-semiconductor field-effect transistors on a free-standing GaN substrate for 1.2-kV-class operation," Applied Physics Express, vol. 8, No. 054101, 2015, 4 pages.

Chaney, A. et al., "Realization of the First GaN Based Tunnel Field-Effect Transistor," 76$^{th}$ Device Research Conference (DRC), Santa Barbara, CA, 2018, 3 pages.

Im, K-S. et al., "Fabrication of AlGaN/GaN Ω-shaped nanowire fin-shaped FETs by a top-down approach," Applied Physics Express, vol. 8, No. 066501, 2015, 4 pages.

Kim, D-S. et al., "Normally-Off AlGaN/GaN Metal-Oxide-Semiconductor Heterostructure Field-Effect Transistor with Recessed Fate and p-GaN Back-Barrier," Japanese Journal of Applied Physics, vol. 51, No. 034101, 2012, 6 pages.

Liu, C. et al., "645 V Quasi-Vertical GaN Power Transistors on silicon substrates," Proceedings of the 30$^{th}$ International Symposium on Power Semiconductor Devices & ICs, May 13-17, 2018, Chicago, USA, 4 pages.

\* cited by examiner

SEMICONDUCTOR DEVICE

CROSS-REFERENCE TO RELATED APPLICATIONS

This application is based upon and claims the benefit of priority from Japanese Patent Application No. 2020-188493, filed on Nov. 12, 2020; the entire contents of which are incorporated herein by reference.

FIELD

Embodiments described herein relate generally to a semiconductor device.

BACKGROUND

For example, there are semiconductor devices such as transistors using nitride semiconductors. Improvement of characteristics is desired in semiconductor devices.

DETAILED DESCRIPTION

Figure 1:
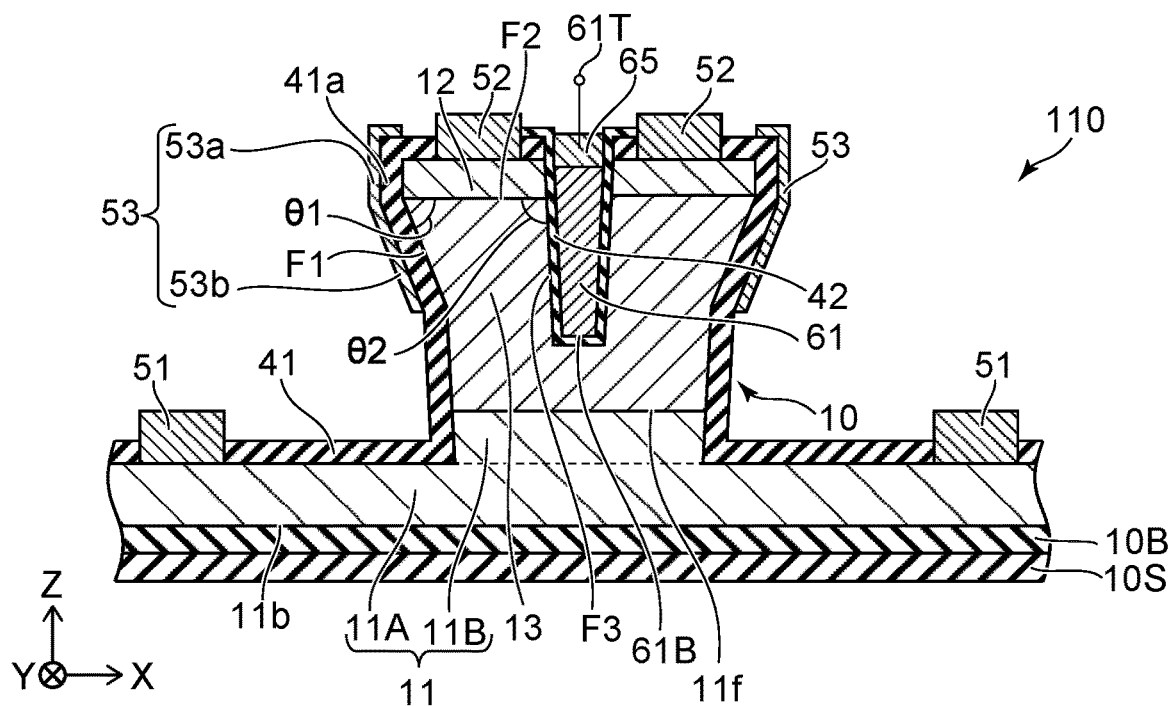
FIG. 1 is a schematic cross-sectional view illustrating the semiconductor device according to the first embodiment.

According to the embodiment of the invention, the semiconductor device includes a semiconductor member, a first electrode, a second electrode, a third electrode, a first conductive member, and a first insulating member. The first semiconductor member includes a first semiconductor region including an $Al_{x1}Ga_{1-x1}N$ ($0 \leq x1 < 1$) of a first conductive type, a second semiconductor region, and a third semiconductor region. The second semiconductor region includes one of a first material or a second material. The first material includes an $Al_{y1}Ga_{1-y1}N$ ($0 \leq y1 < 1$) of the first conductive type. The second material includes an $Al_{y2}Ga_{1-y2}N$ ($0 < y2 \leq 1$). The third semiconductor region is provided between at least a part of the first semiconductor region and the second semiconductor region. The third semiconductor region includes an $Al_{x3}Ga_{1-x3}N$ ($0 \leq x3 < 1$, $x3 < y2$) of the first conductive type. A concentration of an impurity of the first conductive type in the third semiconductor region is lower than a concentration of the impurity of the first conductive type in the first semiconductor region, and is lower than a concentration of the impurity of the first conductive type in the first material. The first electrode is electrically connected with the first semiconductor region. The second electrode is electrically connected with the second semiconductor region. A second direction from a part of the third electrode to the second semiconductor region crosses a first direction from the first semiconductor region to the second semiconductor region. At least a part of the third semiconductor region is between an other portion of the third electrode and the first conductive member in the second direction. At least a part of the first insulating member is between the third electrode and the semiconductor member.

According to one embodiment, a semiconductor device includes a semiconductor member, a first electrode, a second electrode, a third electrode, and a first insulating member. The semiconductor member includes a first semiconductor region including an $Al_{x1}Ga_{1-x1}N$ ($0 \leq x1 < 1$) of a first conductive type, a second semiconductor region, and a third semiconductor region. The second semiconductor region includes one of a first material or a second material, and the first material includes an $Al_{y1}Ga_{1-y1}N$ ($0 \leq y1 < 1$) of the first conductive type. The second material includes an $Al_{y2}Ga_{1-y2}N$ ($0 < y2 \leq 1$). The third semiconductor region is provided between at least a part of the first semiconductor region and the second semiconductor region. The third semiconductor region includes an $Al_{x3}Ga_{1-x3}N$ ($0 \leq x3 < 1$, $x3 < y2$) of the first conductive type. A concentration of an impurity of the first conductive type in the third semiconductor region is lower than a concentration of the impurity of the first conductive type in the first semiconductor region. The concentration of the impurity of the first conductive type in the third semiconductor region is lower than a concentration of the impurity of the first conductive type in the first material. The first electrode is electrically connected with the first semiconductor region. The second electrode is electrically connected with the second semiconductor region. A second direction from a portion of the third electrode to the second semiconductor region crosses a first direction from the first semiconductor region to the second semiconductor region. A direction from an other portion of the third electrode to at least a part of the third semiconductor region is along the second direction. At least a part of the first insulating member is between the third electrode and the semiconductor member. The at least a part of the third semiconductor region includes a first face facing the third electrode. The third semiconductor region includes a second face facing the second semiconductor region. A first angle between the first face and the second face is smaller than 90 degrees.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously in an antecedent drawing are marked with like reference numerals, and a detailed description is omitted as appropriate.

First Embodiment

Figure 2:
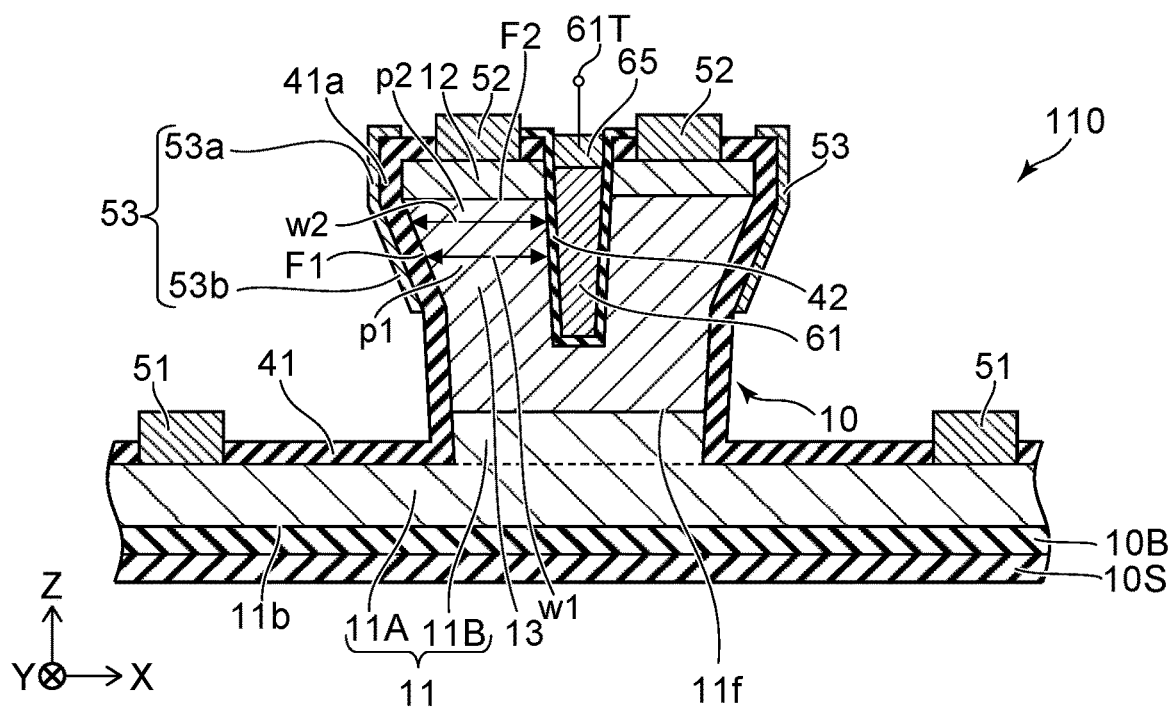
FIG. 2 is a schematic cross-sectional view illustrating the semiconductor device according to the first embodiment.

FIG. 1 and FIG. 2 are schematic cross-sectional views illustrating the semiconductor device according to the first embodiment.

As shown in FIG. 1, the semiconductor device 110 according to the embodiment includes a semiconductor member 10, a first electrode 51, a second electrode 52, a third electrode 53, a first conductive member 61, and a first insulating member 41.

The semiconductor member 10 includes a first semiconductor region 11, a second semiconductor region 12, and a third semiconductor region 13.

The first semiconductor region 11 includes an $Al_{x1}Ga_{1-x1}N$ ($0 \leq x1 < 1$) of a first conductive type. The first conductive type is, for example, an n-type. In the embodiment, the first conductive type may be a p-type. In the following, the first conductive type is the n-type. The composition ratio x1 of Al in the first semiconductor region 11 is, for example, not less than 0 and not more than 0.1. The first semiconductor region 11 includes, for example, an n-type GaN. The first semiconductor region 11 includes, for example, n$^+$-GaN.

The second semiconductor region 12 includes one of a first material and a second material. The first material includes an $Al_{y1}Ga_{1-y1}N$ ($0 \leq y1 < 1$) of the first conductive type. The second material includes an $Al_{y2}Ga_{1-y2}N$ ($0 < y2 \leq 1$). The composition ratio y1 of Al in the first material is, for example, not less than 0 and not more than 0.1. The first material includes, for example, n-type GaN. The first material includes, for example, n$^+$-GaN. The second material is, for example, AlGaN. The composition ratio y2 of Al in the second material is, for example, more than 0.1 and not more than 0.8.

The third semiconductor region 13 is provided between at least a part of the first semiconductor region 11 and the second semiconductor region 12. The third semiconductor region 13 includes an $Al_{x3}Ga_{1-x3}N$ ($0 \leq x3 < 1$, $x3 < y2$) of the first conductive type. A concentration of a first conductive type impurity in the third semiconductor region 13 is lower than a concentration of the first conductive type impurity in the first semiconductor region 11. When the second semiconductor region 12 includes the first material, the concentration of the first conductive type impurity in the third semiconductor region 13 is lower than a concentration of the first conductive type impurity in the first material. The composition ratio x3 of Al in the third semiconductor region 13 is, for example, not less than 0 and not more than 0.2. The third semiconductor region 13 includes, for example, an n-type GaN. The third semiconductor region 13 includes n$^-$-GaN.

A first direction from the first semiconductor region 11 to the second semiconductor region 12 is a Z-axis direction. A direction perpendicular to the Z-axis direction is taken as an X-axis direction. A direction perpendicular to the Z-axis direction and the X-axis direction is taken as a Y-axis direction. The first direction (Z-axis direction) corresponds to a stacking direction of the semiconductor member 10.

In this example, the first semiconductor region 11 includes the first semiconductor portion 11A and the second semiconductor portion 11B. There is a second semiconductor portion 11B between the first semiconductor portion 11A and the third semiconductor region 13. The first semiconductor portion 11A may include a portion that does not overlap the second semiconductor region 12 and the third semiconductor region 13 in the Z-axis direction.

In this example, the base body 10S and the intermediate layer 10B are provided. The intermediate layer 10B is provided between the base body 10S and the semiconductor member 10. The base body 10S includes, for example, a silicon substrate. The intermediate layer 10B is, for example, a buffer layer. The intermediate layer 10B includes, for example, a nitride semiconductor. The intermediate layer 10B includes, for example, AlN and the like. The intermediate layer 10B may include AlGaN or the like. For example, the intermediate layer 10B is provided on the base body 10S. The semiconductor member 10 is provided on the intermediate layer 10B. For example, the lower surface 11b of the first semiconductor region 11 faces the base body 10S.

The first electrode 51 is electrically connected with the first semiconductor region 11. The second electrode 52 is electrically connected with the second semiconductor region 12.

A second direction from a portion 53a of the third electrode 53 to the second semiconductor region 12 crosses the first direction (Z-axis direction) from the first semiconductor region 11 to the second semiconductor region 12. The second direction is, for example, the X-axis direction.

At least a part of the third semiconductor region 13 is between an other portion 53b of the third electrode 53 and the first conductive member 61 in the second direction (for example, the X-axis direction).

At least a part of the first insulating member 41 is between the third electrode 53 and the semiconductor member 10. In this example, a part 41a of the first insulating member 41 is between the third electrode 53 and the semiconductor member 10.

The semiconductor device 110 may include a second insulating member 42. At least a part of the second insulating member 42 is provided between the first conductive member 61 and the semiconductor member 10.

In the embodiment, a current flowing between the first electrode 51 and the second electrode 52 is controlled by a potential of the third electrode 53. The potential of the third electrode 53 is, for example, a potential based on the potential of the second electrode 52. The first electrode 51 is, for example, a drain electrode. The second electrode 52 is, for example, a source electrode. The third electrode 53 is, for example, a gate electrode. A part 41a of the first insulating member 41 is, for example, a gate insulating film. The semiconductor device 110 is, for example, a transistor. When the second semiconductor region 12 includes the second material, a carrier region (for example, a two-dimensional electron gas or the like) may be formed in the vicinity of an interface between the third semiconductor region 13 and the second semiconductor region 12.

In embodiments, by controlling a potential of the first conductive member 61, for example, a threshold voltage can be controlled. For example, a high threshold voltage can be obtained. According to the embodiment, it is possible to provide a semiconductor device capable of improving characteristics.

As shown in FIG. 1, the semiconductor device 110 may include a first conductive member terminal 61T. The first conductive member terminal 61T is electrically connected with the first conductive member 61. In this example, the first conductive member terminal 61T is electrically connected with the first conductive member 61 via the conductive layer 65. For example, the threshold voltage can be controlled by the potential of the first conductive member terminal 61T. The first conductive member 61 functions as, for example, a back barrier.

In one example, the first conductive member 61 includes at least one selected from the group consisting of metal, silicon, and an $Al_{z1}Ga_{1-z1}N$ ($0 \le z1 \le 1$) of a second conductive type. The first conductive member 61 may include, for example, a metal such as aluminum, gold, silver, copper, titanium, nickel and tungsten. The first conductive member 61 may include, for example, polysilicon. The first conductive member 61 may include p-type AlGaN, p-type GaN, or the like. As described later, when the first conductive member 61 includes $Al_{z1}Ga_{1-z1}N$ of the second conductive type, the second insulating member 42 may be omitted.

As shown in FIG. 1, in the embodiment, a position of the first electrode 51 in the first direction (Z-axis direction) is between a position of a part of the first semiconductor region 11 (for example, the first semiconductor portion 11A) in the first direction and a position of the second electrode 52 in the first direction. For example, the direction from the first electrode 51 to the second electrode 52 is along the stacking direction of the semiconductor member 10. As a result, a distance between the first electrode 51 and the second electrode 52 in the X-axis direction can be shortened. For example, the device area can be reduced. For example, a current per unit area can be increased. For example, a low on-resistance is obtained.

As shown in FIG. 1, at least a part of the third semiconductor region 13 includes a first face F1. The first face F1 faces the other portion 53b of the third electrode 53. The third semiconductor region 13 includes a second face F2. The second face F2 faces the second semiconductor region 12. An angle between the first face F1 and the second face F2 is defined as a first angle θ1. In the embodiment, the first angle θ1 may be smaller than 90 degrees. The first face F1 has, for example, an anti-tapered shape. Since the first angle θ1 is smaller than 90 degrees, the threshold voltage can be increased, for example.

As shown in FIG. 1, the first semiconductor region 11 includes a facing surface 11f. The facing surface 11f faces the third semiconductor region 13. The facing surface 11f corresponds to, for example, the upper surface of the first semiconductor region 11. The facing surface 11f is between the lower surface 11b and the third semiconductor region 13.

In the embodiment, the facing surface 11f is along a group III face of $Al_{x1}Ga_{1-x1}N$. For example, the facing surface 11f is a Ga face of $Al_{x1}Ga_{1-x1}N$. In such a semiconductor member 10, the first face F1 of the third semiconductor region 13 has an anti-tapered shape. As a result, a high threshold voltage can be easily obtained.

As shown in FIG. 1, at least a part of the third semiconductor region 13 includes a third face F3. The third face F3 faces the first conductive member 61. When the second insulating member 42 is provided, the third face F3 faces the first conductive member 61 via the second insulating member 42. An angle between the third face F3 and the second face F2 is defined as a second angle θ2. The second angle θ2 is greater than 90 degrees. For example, the third face F3 has a forward taper shape.

For example, an absolute value of an angle between the Z-axis direction and the first face F1 is larger than an absolute value of an angle between the Z-axis direction and the third face F3. For example, an inclination angle of the first face F1 is larger than an inclination angle of the third face F3. For example, the absolute value of the difference between the second angle θ2 and 90 degrees is smaller than the absolute value of the difference between the first angle θ1 and 90 degrees. For example, the second angle θ2 is not less than 91 degrees and not more than 149 degrees. For example, the first angle θ1 is not less than 30 degrees and not more than 88 degrees.

Due to the first angle θ1 and the second angle θ2 as described above, a current confinement structure is formed in the current path flowing between the first electrode 51 and the second electrode 52.

As shown in FIG. 2, at least a part of the third semiconductor region 13 includes a first position p1 and a second position p2. The second position p2 is between the first position p1 and the second semiconductor region 12 in the first direction (Z-axis direction). A width along the second direction (X-axis direction) of the third semiconductor region 13 at the first position p1 is defined as a first width w1. A width along the second direction of the third semiconductor region 13 at the second position p2 is defined as a second width w2. The first width w1 is narrower than the second width w2.

In the embodiment, a depletion layer is formed in the third semiconductor region 13 according to the potential of the third electrode 53. A depletion layer is formed in the third semiconductor region 13 according to the potential of the first conductive member 61. The region between the two depletion layers is the current path. The width of the current path along the X-axis direction varies along the Z-axis direction. Since the first width w1 is narrower than the second width w2, the current path is narrowed. For example, the threshold voltage can be increased more stably.

By controlling the first angle θ1 and the second angle θ2, the threshold voltage can be controlled with high accuracy.

In the embodiment, for example, since the first face F1 has an anti-tapered shape, it is possible to suppress the local increase in the electric field in the third semiconductor region 13. This makes it easier to obtain a high breakdown voltage, for example.

As shown in FIG. 1, the first conductive member 61 includes one end 61B in the first direction (Z-axis direction). The end portion 61B is an end portion on the side of the first semiconductor region 11. The position of the end portion 61B in the first direction is between the position of the facing surface 11f in the first direction and the position of the second surface F2 in the first direction.

As shown in FIG. 1, the semiconductor device 110 may be provided with a plurality of first electrodes 51, a plurality of second electrodes 52, and a plurality of third electrodes 53. For example, the first conductive member 61 is located between the plurality of third semiconductor regions 13 in the second direction (X-axis direction).

The semiconductor member 10 may include a plurality of second semiconductor regions 12. One of the plurality of second semiconductor regions 12 is located between one of the plurality of third electrodes 53 and the first conductive member 61 in the second direction. An other one of the plurality of second semiconductor regions 12 is between an other one of the plurality of third electrodes 53 and the first conductive member 61 in the second direction.

As shown in FIG. 1, a part of the third electrode 53 may be provided on the second semiconductor region 12 via the first insulating member 41. For example, a part of the first insulating member 41 may be located between the first semiconductor region 11 and another part of the third electrode 53 in the first direction (Z-axis direction). For example, the control operation by the third electrode 53 becomes more stable.

Figure 3:
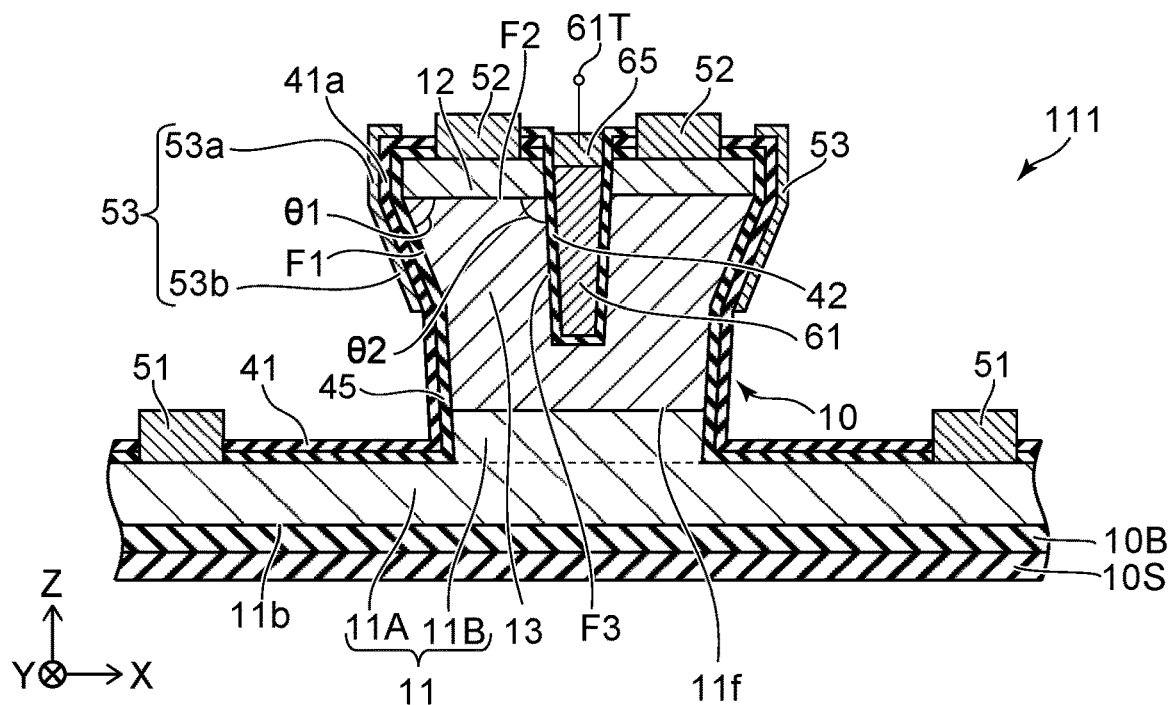
FIG. 3 is a schematic cross-sectional view illustrating the semiconductor device according to the first embodiment.

FIG. 3 is a schematic cross-sectional view illustrating the semiconductor device according to the first embodiment.

As shown in FIG. 3, the semiconductor device 111 according to the embodiment includes a first layer 45 in addition to the semiconductor member 10, the first electrode 51, the second electrode 52, the third electrode 53, the first conductive member 61, and the first insulating member 41. Other configurations of the semiconductor device 111 may be the same as those of the semiconductor device 110.

The first layer 45 is provided between the first insulating member 41 and the semiconductor member 10. The first layer 45 includes $Al_{y3}Ga_{1-y3}N$ (x1<y3≤1). The first layer 45 includes, for example, AlN or AlGaN. The composition ratio y3 of Al in the first layer 45 is preferably 0.8 or more, for example. By providing the first layer 45, for example, a higher threshold value can be obtained.

Figure 4:
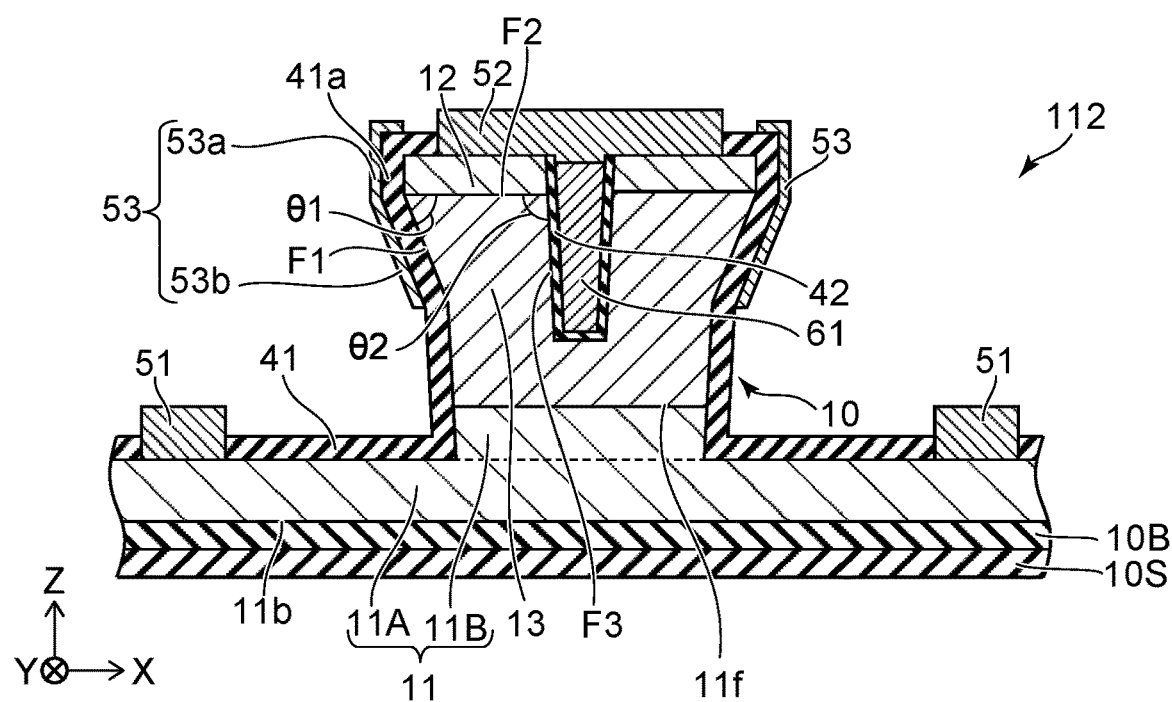
FIG. 4 is a schematic cross-sectional view illustrating the semiconductor device according to the first embodiment.

FIG. 4 is a schematic cross-sectional view illustrating the semiconductor device according to the first embodiment.

As shown in FIG. 4, the semiconductor device 112 according to the embodiment includes the semiconductor member 10, the first electrode 51, the second electrode 52, the third electrode 53, the first conductive member 61, and the first insulating member 41. In the semiconductor device 112, the second electrode 52 is electrically connected with the first conductive member 61. Other configurations of the semiconductor device 112 may be the same as those of the semiconductor device 110. For example, a high threshold voltage can be obtained. The device area can be further reduced. For example, it is easier to obtain a lower on-resistance.

Figure 5:
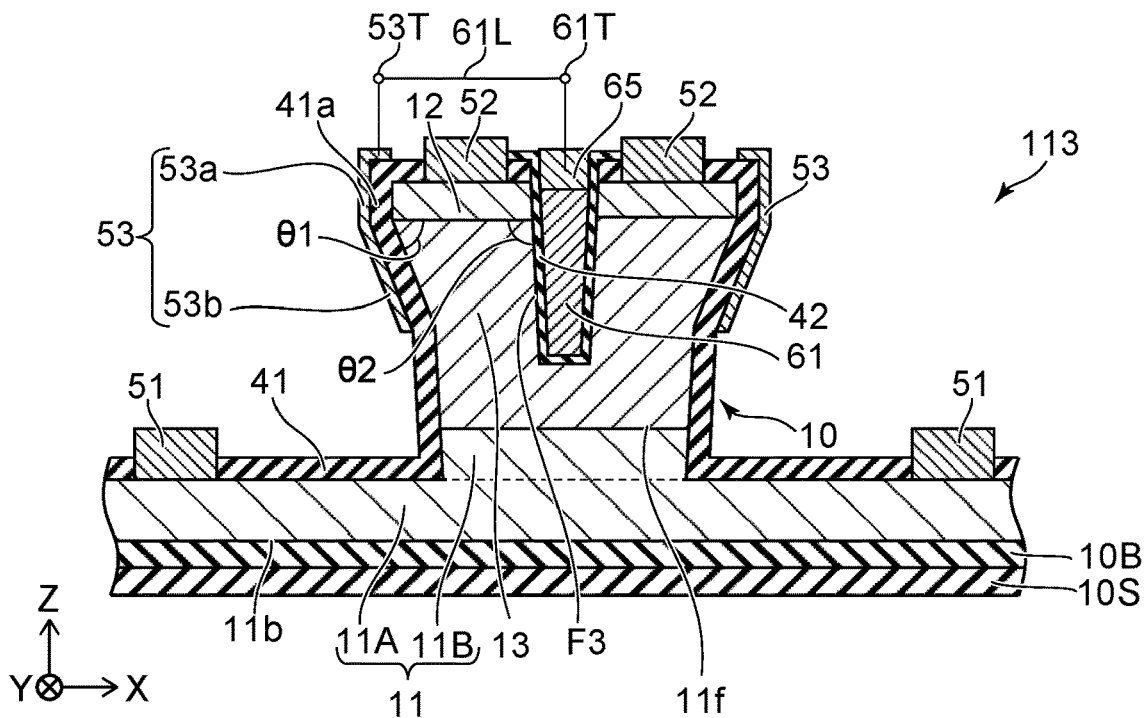
FIG. 5 is a schematic cross-sectional view illustrating the semiconductor device according to the first embodiment.

FIG. 5 is a schematic cross-sectional view illustrating the semiconductor device according to the first embodiment.

As shown in FIG. 5, the semiconductor device 113 according to the embodiment includes the semiconductor member 10, the first electrode 51, the second electrode 52, the third electrode 53, the first conductive member 61, and the first insulating member 41. In the semiconductor device 113, the third electrode 53 is electrically connected with the first conductive member 61. Other configurations of the semiconductor device 113 may be the same as those of the semiconductor device 110.

In the semiconductor device 113, for example, the third electrode 53 may be electrically connected with the first conductive member 61 via the connecting member 61L. For example, a third electrode terminal 53T electrically connected with the third electrode 53 may be provided. The third electrode terminal 53T and the first conductive member terminal 61T may be electrically connected by the connecting member 61L. For example, a high threshold voltage can be obtained.

As described above, in the embodiment, the first conductive member 61 may be electrically connected with one of the second electrode 52 and the third electrode 53.

In the semiconductor devices 110 to 113, the position of the first electrode 51 in the first direction (Z-axis direction) is between the position of a part of the first semiconductor region 11 (the first semiconductor portion 11A) in the first direction between the position of the electrode 52 in the first direction.

Figure 6:
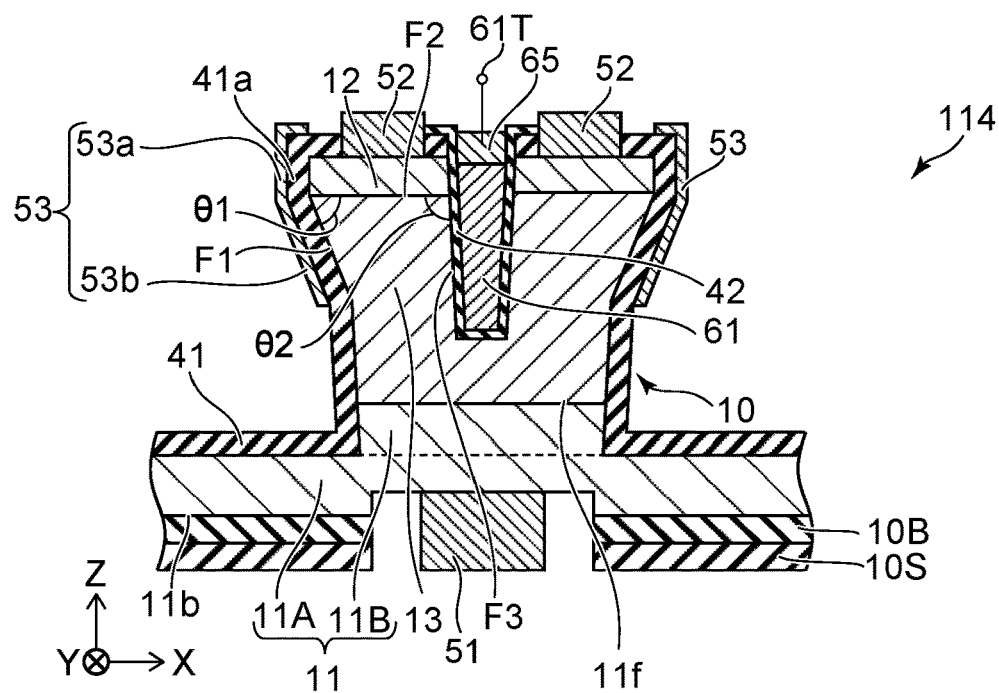
FIG. 6 is a schematic cross-sectional view illustrating the semiconductor device according to the first embodiment.

FIG. 6 is a schematic cross-sectional view illustrating the semiconductor device according to the first embodiment.

As shown in FIG. 6, the semiconductor device 114 according to the embodiment includes the semiconductor member 10, the first electrode 51, the second electrode 52, the third electrode 53, the first conductive member 61, and a first insulating member 41. The position of the first electrode 51 in the semiconductor device 114 is different from the position of the first electrode 51 in the semiconductor device 110. Other configurations of the semiconductor device 114 may be the same as those of the semiconductor device 110.

In the semiconductor device 114, at least a part of the semiconductor member 10 is between the first electrode 51 and the second electrode 52 in the first direction (Z-axis direction). For example, the size of the semiconductor device in X-axis direction is decreased. In the semiconductor device 114, the device area can be further reduced. For example, it is easier to obtain a lower on-resistance.

Figure 7:
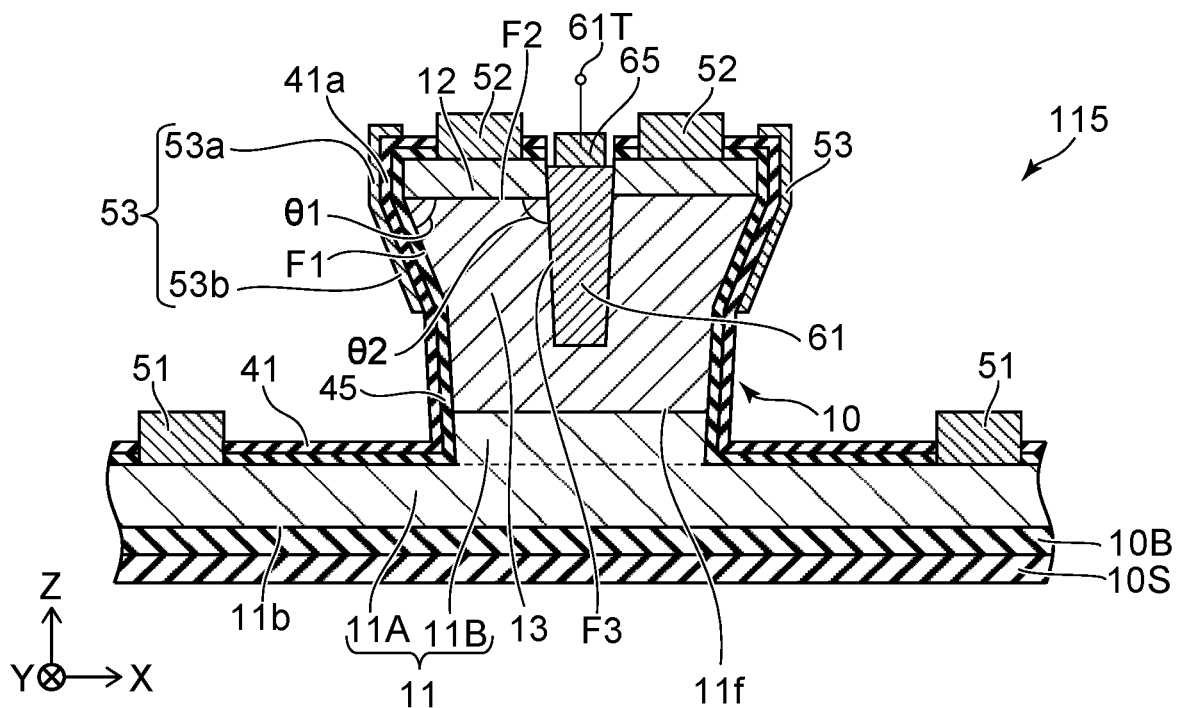
FIG. 7 is a schematic cross-sectional view illustrating the semiconductor device according to the first embodiment.

FIG. 7 is a schematic cross-sectional view illustrating the semiconductor device according to the first embodiment.

As shown in FIG. 7, the semiconductor device 115 according to the embodiment includes the semiconductor member 10, the first electrode 51, the second electrode 52, the third electrode 53, the first conductive member 61, and the first insulating member 41. In the semiconductor device 115, the second insulating member 42 is omitted. Other configurations in the semiconductor device 115 may be the same as the configuration of the semiconductor device 110.

In the semiconductor device 115, the first conductive member 61 includes an $Al_{z1}Ga_{1-z1}N$ (0≤z1≤1) of the second conductive type. The first conductive member 61 includes, for example, p-type AlGaN or p-type GaN. In this case, the first conductive member 61 may contact the third semiconductor region 13. For example, the first conductive member 61 may contact the semiconductor member 10. The second insulating member 42 can be omitted. The configuration of the semiconductor device becomes simple.

Second Embodiment

Figure 8:
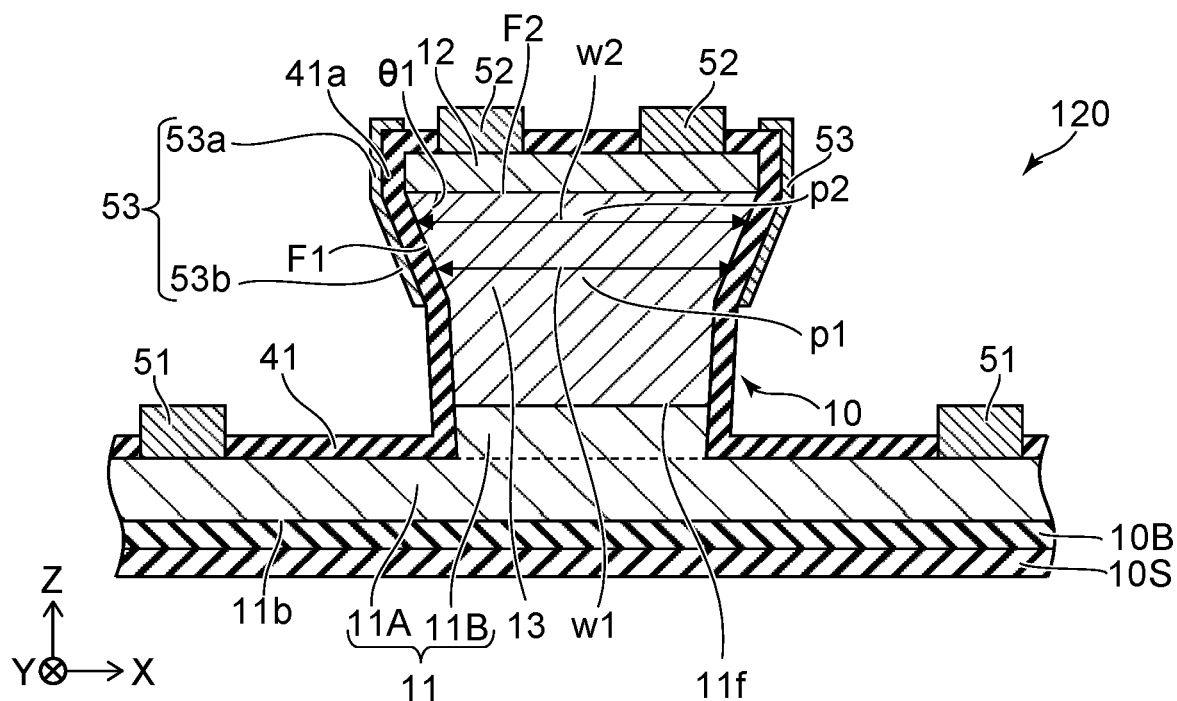
FIG. 8 is a schematic cross-sectional view illustrating the semiconductor device according to the second embodiment.

FIG. 8 is a schematic cross-sectional view illustrating the semiconductor device according to the second embodiment.

As shown in FIG. 8, the semiconductor device 120 according to the embodiment includes the semiconductor member 10, the first electrode 51, the second electrode 52, the third electrode 53, and the first insulating member 41. The semiconductor member 10 includes the first semiconductor region 11, the second semiconductor region 12, and the third semiconductor region 13. The first semiconductor region 11 includes the $Al_{x1}Ga_{1-x1}N$ (0≤x1<1) of the first conductive type. The second semiconductor region 12 includes one of the first material and the second material. The first material includes the $Al_{y1}Ga_{1-y1}N$ (0≤y1<1) of the first conductive type. The second material includes the $Al_{y2}Ga_{1-y2}N$ (0<y2≤1). The third semiconductor region 13 is provided between at least a part of the first semiconductor region 11 and the second semiconductor region 12. The third semiconductor region 13 includes the $Al_{x3}Ga_{1-x3}N$ (0≤x3<1, x3<y2) of the first conductive type. The concentration of the first conductive type impurity in the third semiconductor region 13 is lower than the concentration of the first conductive type impurity in the first semiconductor region 11. The concentration of the first conductive type impurity in the third semiconductor region 13 is lower than the concentration of the first conductive type impurity in the first material.

The first electrode 51 is electrically connected with the first semiconductor region 11. The second electrode 52 is electrically connected with the second semiconductor region 12. The second direction from a portion 53a of the third electrode 53 to the second semiconductor region 12 crosses the first direction (for example, the Z-axis direction) from the first semiconductor region 11 to the second semiconductor region 12. The direction from the other portion 53b of the third electrode 53 to at least a part of the third semiconductor region 13 is along the second direction (for example, the X-axis direction). At least a part of the first insulating member 41 is between the third electrode 53 and the semiconductor member 10.

At least a part of the third semiconductor region 13 includes the first face F1 facing the third electrode 53. The third semiconductor region 13 includes the second face F2 facing the second semiconductor region 12. The first angle θ1 between the first face F1 and the second face F2 is less than 90 degrees. For example, the first face F1 has an anti-tapered shape. With such a first angle θ1, for example, a high threshold voltage can be obtained. It is possible to provide a semiconductor device whose characteristics can be improved.

In the semiconductor device 120, the first semiconductor region 11 includes a facing surface 11f facing the third semiconductor region 13. The facing surface 11f is along the group III surface of $Al_{x1}Ga_{1-x1}N$. The facing surface 11f is, for example, the Ga surface.

In the semiconductor device 120, the configuration described with respect to the first embodiment can be applied except for the first conductive member 61 and the second insulating member 42.

For example, at least a part of the third semiconductor region 13 includes the first position p1 and the second position p2. The second position p2 is between the first position p1 and the second semiconductor region 12 in the first direction (Z-axis direction). The first width w1 along the second direction of the third semiconductor region 13 at the first position p1 is narrower than the second width w2 along the second direction of the third semiconductor region 13 at the second position p2. For example, the current confinement structure is provided in the current path. For example, it is easy to obtain a high threshold voltage.

In the semiconductor device 120, the position of the first electrode 51 in the first direction (Z-axis direction) is between the position of the position of a part of the first semiconductor region 11 (for example, the first semiconductor portion 11A) in the first direction and the second position and the position of the electrode 52 in the first direction. In the second embodiment, similarly to the semiconductor device 114, at least a part of the semiconductor member 10 may be provided between the first electrode 51 and the second electrode 52 in the first direction (Z-axis direction).

In the second embodiment, the first layer 45 including $Al_{y3}Ga_{1-y3}N$ (x1<y3≤1) may be provided as in the semiconductor device 111. The first layer 45 is provided between the first insulating member 41 and the semiconductor member 10. A higher threshold is obtained.

In the first embodiment and the second embodiment, base body 10S may include at least one selected from the group consisting of, for example, silicon, silicon carbide, sapphire, gallium nitride and aluminum nitride. The first electrode 51 includes, for example, at least one selected from the group consisting of titanium, aluminum, nickel, silver, tantalum, platinum, molybdenum, and gold. The second electrode 52 includes, for example, at least one selected from the group consisting of titanium, aluminum, nickel, silver, tantalum, platinum, molybdenum, and gold. The third electrode 53 includes at least one selected from the group consisting of titanium nitride, nickel, platinum, gold, copper, and tungsten. At least one of the first insulating member 41 and the second insulating member 42 includes at least one selected from the group consisting of silicon, aluminum hafnium and titanium, and at least one selected from the group consisting of oxygen and nitrogen.

Third Embodiment

The third embodiment relates to a method for manufacturing a semiconductor device. Hereinafter, an example of a method for manufacturing the semiconductor device 110 will be described as an example of the third embodiment.

FIGS. 9A to 9D, FIGS. 10A to 10D, FIGS. 11A to 11D, and FIG. 12 are schematic cross-sectional views illustrating the manufacturing method of semiconductor devices according to the third embodiment.

Figure 9A:
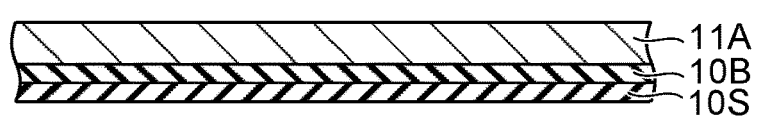
FIGS. 9A to 9D are schematic cross-sectional views illustrating a method for manufacturing a semiconductor device according to a third embodiment.

As shown in FIG. 9A, the first semiconductor portion 11A is prepared. The first semiconductor portion 11A is provided on the intermediate layer 10B provided on the base body 10S.

Figure 9B:
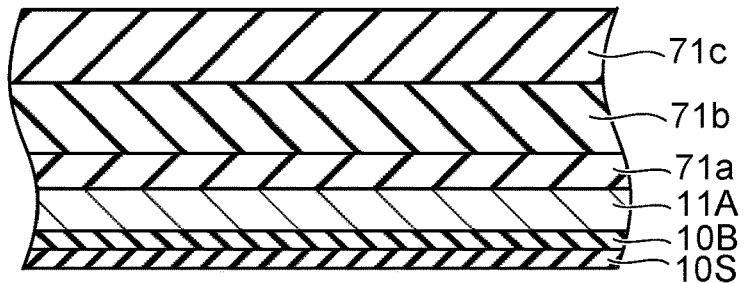

As shown in FIG. 9B, a first processing layer 71a, a second processing layer 71b, and a third processing layer 71c are formed on the first semiconductor portion 11A. The materials of these layers may be different from each other.

Figure 9C:
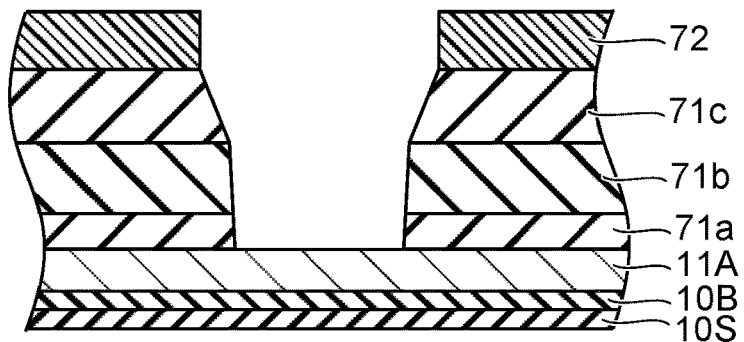

As shown in FIG. 9C, a resist layer 72 is provided on the above-mentioned processing layers, and a part of the resist layer 72 is removed. Using the resist layer 72 as a mask, a part of each of the first processing layer 71a, the second processing layer 71b, and the third processing layer 71c is removed. Due to the different materials of these processing layers, the angles of the side faces of these processing layers being remained are different from each other. For example, the side surface of the second processing layer 71b has a forward taper shape. In the region where the processing layers are removed, the surface of the first semiconductor portion 11A is exposed.

Figure 9D:
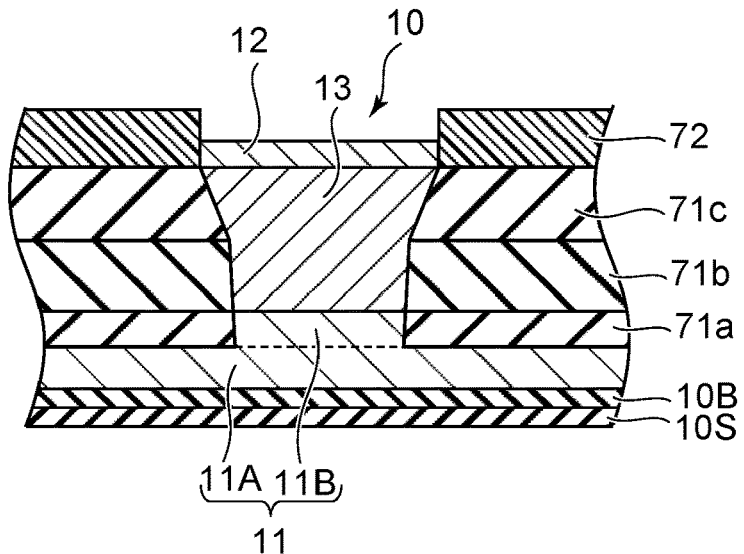

As shown in FIG. 9D, the second semiconductor portion 11B, the third semiconductor region 13, and the second semiconductor region 12 are grown on the surface of the exposed first semiconductor portion 11A. As a result, the semiconductor member 10 is obtained.

Figure 10A:
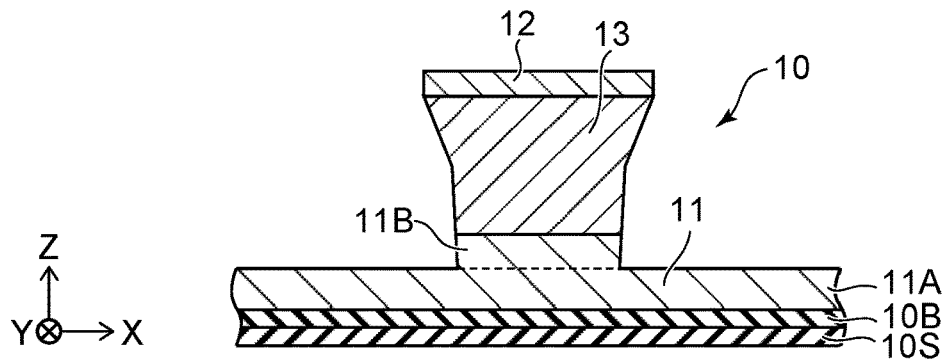
FIGS. 10A to 10D are schematic cross-sectional views illustrating a method for manufacturing a semiconductor device according to a third embodiment.

As shown in FIG. 10A, the first processing layer 71a, the second processing layer 71b, and the third processing layer 71c are removed.

Figure 10B:
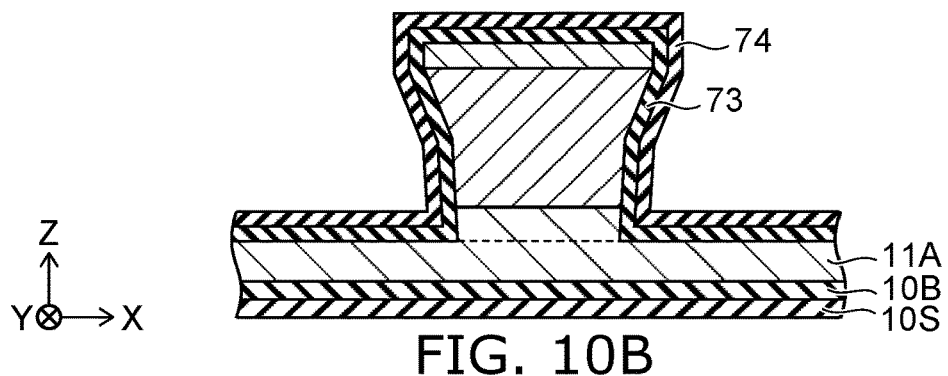

As shown in FIG. 10B, the insulating film 73 and the insulating film 74 are formed. The insulating film 73 includes, for example, at least one selected from the group consisting of silicon dioxide, silicon nitride, aluminum oxide, hafnium oxide, and aluminum silicon oxide. The insulating film 74 includes, for example, at least one selected from the group consisting of photoresist, silicon dioxide, silicon nitride, aluminum oxide, hafnium oxide, and aluminum silicon oxide.

Figure 10C:
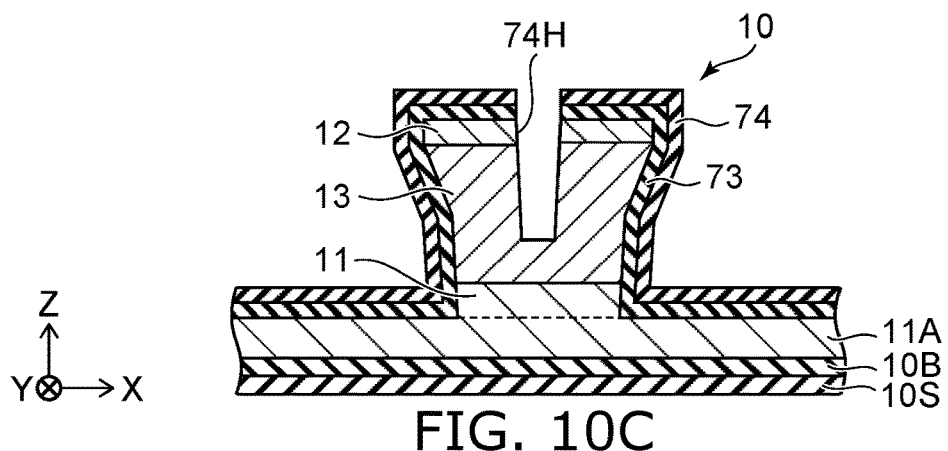

As shown in FIG. 10C, a part of the insulating film 73 and the insulating film 74 is removed. Holes 74H are formed in the semiconductor member 10 by using the insulating film 73 and the insulating film 74 as masks. The bottom of the hole 74H reaches the third semiconductor region 13.

Figure 10D:
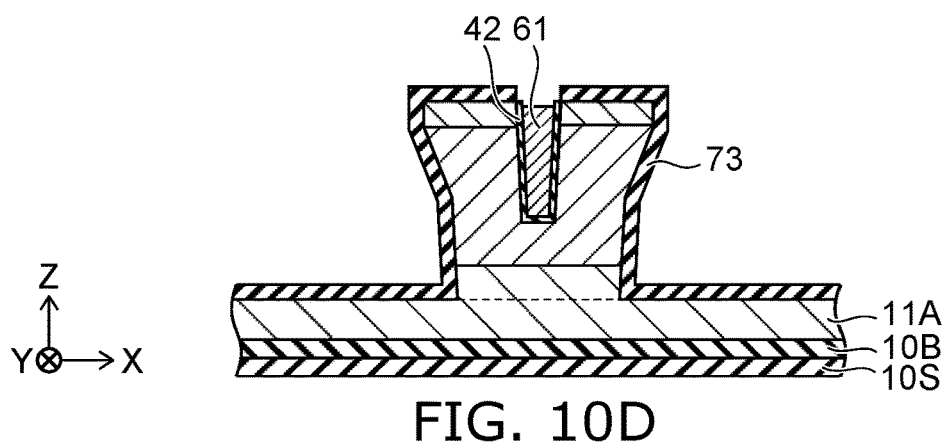

As shown in FIG. 10D, the second insulating member 42 is formed in the hole 74H, and the first conductive member 61 is further formed.

Figure 11A:
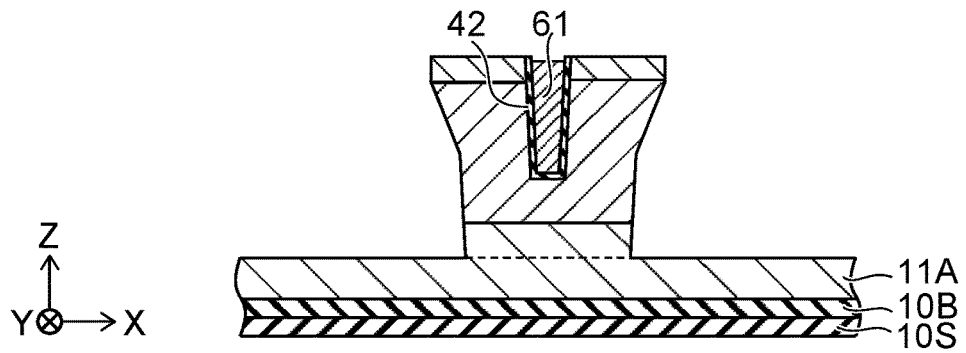
FIGS. 11A to 11D are schematic cross-sectional views illustrating a method for manufacturing a semiconductor device according to a third embodiment.
Figure 11B:
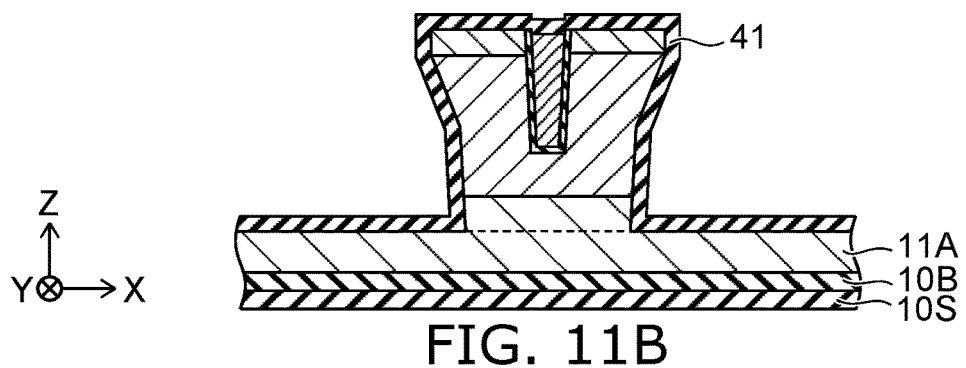
Figure 11C:
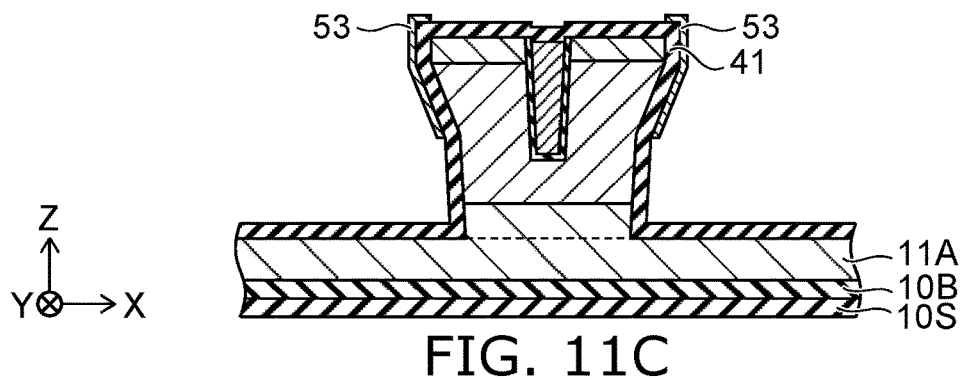
Figure 11D:
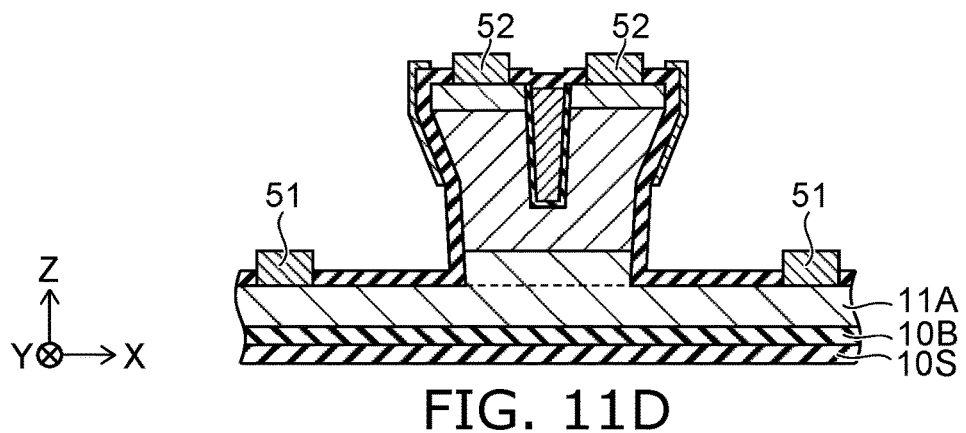
Figure 12:
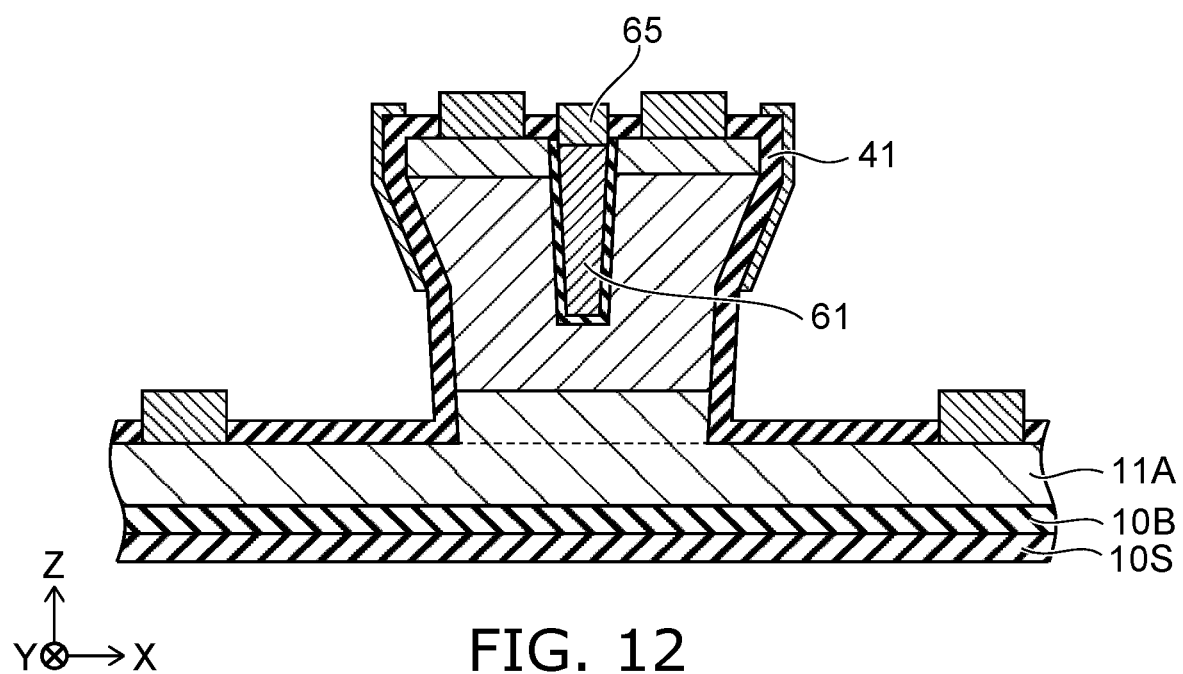
FIG. 12 is a schematic cross-sectional view illustrating a method for manufacturing a semiconductor device according to the third embodiment.

As shown in FIG. 11A, the insulating film 73 and the insulating film 74 are removed. As shown in FIG. 11B, the first insulating member 41 is formed. As shown in FIG. 11C, the third electrode 53 is formed. As shown in FIG. 11D, the first electrode 51 and the second electrode 52 are formed. As shown in FIG. 12, a part of the first insulating member 41 is removed to form the conductive layer 65. As a result, the semiconductor device 110 can be formed.

The other semiconductor devices according to the first embodiment and the second embodiment can also be manufactured by appropriately changing the same manufacturing method as described above. According to the manufacturing method according to the embodiment, a semiconductor device having improved characteristics can be manufactured.

According to the embodiment, it is possible to provide a semiconductor device having improved characteristics.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

In the specification, "nitride semiconductor" includes all compositions of semiconductors of the chemical formula $B_x In_y Al_z Ga_{1-x-y-z}N$ ($0 \leq x \leq 1$, $0 \leq y \leq 1$, $0 \leq z \leq 1$, and $x+y+z \leq 1$) for which the composition ratios x, y, and z are changed within the ranges respectively. "Nitride semiconductor" further includes group V elements other than N (nitrogen) in the chemical formula recited above, various elements added to control various properties such as the conductivity type and the like, and various elements included unintentionally.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in semiconductor devices such as semiconductor members, electrodes, conductive members, insulating members, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor devices practicable by an appropriate design modification by one skilled in the art based on the semiconductor devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
a semiconductor member including:
a first semiconductor region including an $Al_{x1}Ga_{1-x1}N$ ($0 \leq x1 < 1$) of a first conductive type,
a second semiconductor region including one of a first material and a second material, the first material including an $Al_{y1}Ga_{1-y1}N$ ($0 \leq y1 < 1$) of the first conductive type, and the second material including an $Al_{y2}Ga_{1-y2}N$ ($0 < y2 \leq 1$), and
a third semiconductor region provided between at least a part of the first semiconductor region and the second semiconductor region, the third semiconductor region including an $Al_{x3}Ga_{1-x3}N$ ($0 \leq x3 < 1$, $x3 < y2$) of the first conductive type, a concentration of an impurity of the first conductive type in the third semiconductor region being lower than a concentration of the impurity of the first conductive type in the first semiconductor region, and the concentration of the impurity of the first conductive type in the third semiconductor region being lower than a concentration of the impurity of the first conductive type in the first material, the third semiconductor region including a first face and a second face, the second face facing the second semiconductor region, the first face crossing the second face;
a first electrode electrically connected with the first semiconductor region;
a second electrode electrically connected with the second semiconductor region;
a third electrode, a second direction from a portion of the third electrode to the second semiconductor region crossing a first direction from the first semiconductor region to the second semiconductor region, an other portion of the third electrode extending along the first face;
a first conductive member, at least a part of the third semiconductor region being between the other portion of the third electrode and the first conductive member in the second direction; and
a first insulating member, at least a part of the first insulating member being between the third electrode and the semiconductor member.

2. The semiconductor device according to claim 1, wherein
a first angle between the first face and the second face is smaller than 90 degrees.

3. The semiconductor device according to claim 2, wherein
the at least the part of the third semiconductor region further includes a third face facing the first conductive member, and
a second angle between the third face and the second face is larger than 90 degrees.

4. The semiconductor device according to claim 3, wherein an absolute value of a difference between the second angle and 90 degrees is smaller than an absolute value of a difference between the first angle and 90 degrees.

5. The semiconductor device according to claim 3, wherein the second angle is 91 degrees or more and 149 degrees or less.

6. The semiconductor device according to claim 2, wherein the first angle is 30 degrees or more and 88 degrees or less.

7. The semiconductor device according to claim 1, further comprising a second insulating member,
at least a part of the second insulating member being provided between the first conductive member and the semiconductor member.

8. The semiconductor device according to claim 1, wherein the first conductive member includes at least one selected from the group consisting of metal, silicon, and $Al_{z1}Ga_{1-z1}N$ ($0 \leq z1 \leq 1$) of a second conductive type.

9. The semiconductor device according to claim 1, wherein
the first conductive member includes an $Al_{z1}Ga_{1-z1}N$ ($0 \leq z1 \leq 1$) of a second conductive type, and
the first conductive member contacts the third semiconductor region.

10. The semiconductor device according to claim 1, wherein the first conductive member is electrically connected with one of the second electrode and the third electrode.

11. The semiconductor device according to claim 1, further comprising a first conductive member terminal electrically connected with the first conductive member.

12. The semiconductor device according to claim 1, wherein the first conductive member is located between a plurality of the third semiconductor regions in the second direction.

13. The semiconductor device according to claim 1, wherein a plurality of the third electrodes are provided,
the semiconductor member includes a plurality of the second semiconductor regions,
one of the plurality of second semiconductor regions is located between one of the plurality of third electrodes and the first conductive member in the second direction,
an other one of the plurality of second semiconductor regions is located between an other one of the plurality of third electrodes and the first conductive member in the second direction.

14. A semiconductor device, comprising:
a semiconductor member including:
a first semiconductor region including an $Al_{x1}Ga_{1-x1}N$ ($0 \leq x1 < 1$) of a first conductive type,
a second semiconductor region including one of a first material or a second material, and the first material including an $Al_{y1}Ga_{1-y1}N$ ($0 \leq y1 < 1$) of the first conductive type, the second material including an $Al_{y2}Ga_{1-y2}N$ ($0 < y2 \leq 1$), and
a third semiconductor region provided between at least a part of the first semiconductor region and the second semiconductor region, the third semiconductor region including an $Al_{x3}Ga_{1-x3}N$ ($0 \leq x3 < 1$, $x3 < y2$) of the first conductive type, a concentration of an impurity of the first conductive type in the third semiconductor region being lower than a concentration of the impurity of the first conductive type in the first semiconductor region, the concentration of the impurity of the first conductive type in the third semiconductor region being lower than a concentration of the impurity of the first conductive type in the first material;
a first electrode electrically connected with the first semiconductor region;
a second electrode electrically connected with the second semiconductor region;
a third electrode, a second direction from a portion of the third electrode to the second semiconductor region crossing a first direction from the first semiconductor region to the second semiconductor region, a direction from an other portion of the third electrode to at least a part of the third semiconductor region being along the second direction; and
a first insulating member, at least a part of the first insulating member being between the third electrode and the semiconductor member,
the at least a part of the third semiconductor region including a first face facing the third electrode,
the third semiconductor region including a second face facing the second semiconductor region,
the first face crossing the second face, and
a first angle between the first face and the second face being smaller than 90 degrees.

15. The semiconductor device according to claim 1, wherein
the at least a part of the third semiconductor region includes a first position and a second position,
the second position is between the first position and the second semiconductor region in the first direction,
a first width of the third semiconductor region at the first position along the second direction is narrower than a second width of the third semiconductor region at the second position along the second direction.

16. The semiconductor device according to claim 1, wherein
a position of the first electrode in the first direction is between a position of a part of the first semiconductor region in the first direction and a position of the second electrode in the first direction.

17. The semiconductor device according to claim 1, wherein at least a part of the semiconductor member is between the first electrode and the second electrode in the first direction.

18. The semiconductor device according to claim 1, further comprising a first layer including an $Al_{y3}Ga_{1-y3}N$ ($x1 < y3 \leq 1$), and
the first layer is provided between the first insulating member and the semiconductor member.

19. The semiconductor device according to claim 1, wherein
the first semiconductor region includes a facing surface facing the third semiconductor region, and
the facing surface is along a group III surface of the $Al_{x1}Ga_{1-x1}N$.

20. The semiconductor device according to claim 1, wherein a part of the first insulating member is between the first semiconductor region and an other part of the third electrode in the first direction.

* * * * *